(12) United States Patent
Ma et al.

(10) Patent No.: US 12,302,528 B2
(45) Date of Patent: May 13, 2025

(54) COOLING APPARATUS

(71) Applicant: NEW FOCUS LIGHTING & POWER TECHNOLOGY (SHANGHAI) CO., LTD., Shanghai (ES)

(72) Inventors: Chunyang Ma, Shanghai (CN); Yu Liu, Shanghai (CN); Shiquan Gong, Shanghai (CN); Gongyi Chen, Shanghai (CN)

(73) Assignee: NEW FOCUS LIGHTING & POWER TECHNOLOGY (SHANGHAI) CO., LTD., Shanghai (CN)

( * ) Notice: Subject to any disclaimer, the term of this patent is extended or adjusted under 35 U.S.C. 154(b) by 244 days.

(21) Appl. No.: 18/253,538

(22) PCT Filed: Aug. 2, 2021

(86) PCT No.: PCT/CN2021/110160
§ 371 (c)(1),
(2) Date: May 18, 2023

(87) PCT Pub. No.: WO2022/105306
PCT Pub. Date: May 27, 2022

(65) Prior Publication Data
US 2023/0422429 A1 Dec. 28, 2023

(30) Foreign Application Priority Data

Nov. 18, 2020 (CN) .......................... 202011299816.0
Nov. 18, 2020 (CN) .......................... 202022684570.0

(51) Int. Cl.
*H05K 7/20* (2006.01)

(52) U.S. Cl.
CPC ..... *H05K 7/20154* (2013.01); *H05K 7/20172* (2013.01); *H05K 7/2039* (2013.01)

(58) Field of Classification Search
CPC ... H01L 23/38; H01L 23/3672; H01L 23/467; H01L 23/367; H05K 7/20918;
(Continued)

(56) References Cited

U.S. PATENT DOCUMENTS 3,149,666 A * 9/1964 Coe .......................... F02G 1/057
174/15.1
5,559,674 A * 9/1996 Katsui ................... H01L 23/467
174/16.3
(Continued)

FOREIGN PATENT DOCUMENTS

CN  201418227 Y   3/2010
CN  107577305 A   1/2018
(Continued)

*Primary Examiner* — Michael A Matey
(74) *Attorney, Agent, or Firm* — ALBERT BORDAS P.A.

(57) ABSTRACT

A cooling apparatus, comprising a mainboard and a cooling fan, where the novel cooling apparatus comprises: a heat sink, provided on the mainboard and affixed to one end of a vent of the cooling fan. The heat sink comprises: a groove, used for accommodating a heat-generating component provided on the mainboard; cooling fins, distributed within the heat sink and arranged on two sides of the groove. A venting and cooling channel is constituted between the interior of the heat sink and the vent of the cooling fan. The beneficial effect of the technical solution is such that, with other heat-generating components placed in the heat sink, the space in the heat sink is fully utilized, the fan is utilized to cool the heat sink and the heat-generating components therein, thus increasing the utilization rate of the fan, increasing the cooling efficiency, and effectively utilizing space.

7 Claims, 2 Drawing Sheets

(58) Field of Classification Search
CPC ........... H05K 7/20172; H05K 7/20145; H05K 7/20163; H05K 7/2039; H05K 7/20409; H05K 7/20863; H05K 1/0203; H05K 1/021; H05K 1/0272; H05K 1/181; H05K 2201/066; H05K 5/30; H05K 7/20154; H05K 7/20209; H05K 7/20327; H05K 7/209; F28D 15/0233; F28F 3/02; F28F 1/02; F28F 13/06; F28F 2215/00; G06F 1/20

See application file for complete search history.

(56) References Cited

U.S. PATENT DOCUMENTS

| | | | | | |
|---|---|---|---|---|---|
| 5,828,549 | A * | 10/1998 | Gandre | ................. | G06F 1/20 |
| | | | | | 165/185 |
| 6,140,571 | A * | 10/2000 | Kitahara | ............. | G03F 7/70433 |
| | | | | | 174/16.3 |
| 6,489,591 | B1 * | 12/2002 | Achtner | ................ | B23K 9/32 |
| | | | | | 219/130.1 |
| 6,640,882 | B2 * | 11/2003 | Dowdy | ............... | H01L 23/4093 |
| | | | | | 165/80.1 |
| 6,665,183 | B1 * | 12/2003 | Shikata | ............... | H05K 7/20918 |
| | | | | | 363/141 |
| 6,702,002 | B2 * | 3/2004 | Wang | ................ | H01L 23/473 |
| | | | | | 174/15.1 |
| 6,851,467 | B1 * | 2/2005 | Bamford | ............. | H01L 23/3672 |
| | | | | | 165/185 |
| 7,312,994 | B2 * | 12/2007 | Lee | .................. | H01L 23/427 |
| | | | | | 165/185 |
| 7,315,450 | B2 * | 1/2008 | Ishii | ................... | H05K 7/20918 |
| | | | | | 174/16.3 |
| 7,729,119 | B2 * | 6/2010 | Yang | .................... | H01L 23/467 |
| | | | | | 257/714 |
| 10,042,400 | B2 * | 8/2018 | Takeuchi | ........... | H05K 7/20172 |
| 2002/0020517 | A1 | 2/2002 | Hsu | | |
| 2002/0170905 | A1 * | 11/2002 | Peterson | ............ | H05K 7/20918 |
| | | | | | 219/443.1 |
| 2005/0036289 | A1 * | 2/2005 | Lee | .................... | H01L 23/4006 |
| | | | | | 361/699 |
| 2006/0039110 | A1 * | 2/2006 | Foster, Sr. | ............ | F04D 25/166 |
| | | | | | 257/E23.099 |
| 2007/0119583 | A1 * | 5/2007 | Foster | .................. | H01L 23/467 |
| | | | | | 165/185 |
| 2009/0052175 | A1 * | 2/2009 | Xu | .......................... | F21V 29/77 |
| | | | | | 362/373 |
| 2009/0195983 | A1 * | 8/2009 | Reichert | ................ | G06F 1/203 |
| | | | | | 361/695 |
| 2009/0225511 | A1 * | 9/2009 | Hsu | ....................... | H01L 23/467 |
| | | | | | 361/697 |
| 2009/0323284 | A1 * | 12/2009 | Deng | .................... | H01L 23/467 |
| | | | | | 361/697 |
| 2010/0232106 | A1 * | 9/2010 | Kauranen | .......... | H05K 7/20918 |
| | | | | | 361/692 |
| 2015/0305137 | A1 * | 10/2015 | Hunt | ................... | H01L 23/4006 |
| | | | | | 361/697 |
| 2021/0226467 | A1 * | 7/2021 | Chien-An | .......... | H05K 7/20409 |

FOREIGN PATENT DOCUMENTS

| | | |
|---|---|---|
| CN | 110190033 A | 8/2019 |
| CN | 112437590 A | 3/2021 |

* cited by examiner

COOLING APPARATUS

BACKGROUND OF THE INVENTION

Field of the Invention

The present invention relates to the field of device cooling technology, and particularly in relates to a novel cooling apparatus.

Prior Art

With the development of society, people' requirements for electronic products are getting higher and higher, small size and cheap price have become a trend. Usually, there are heat-generating components in electronic products, the smaller the size of product, the higher requirement for cooling of the inner elements. Prior cooling method is mainly providing a cooling fan on the circuit board, forming air heat exchange by the work of the cooling fan, so that the high heat inside equipment is cooled. But the effect of cooling method is not obvious, especially for centrally placed heat-generating components. Therefore, how to provide an effective cooling method for heat-generating components and improve the utilization efficiency of the cooling fan is an urgent problem to be solved.

SUMMARY OF THE INVENTION

In view of the issues of the cooling of the heat-generating components on the mainboard of the equipment in the prior art, a novel cooling apparatus aimed at improving the utilization efficiency of the fan and improving the overall heat cooling efficiency is provided.

Specific technical scheme is as follows. A novel cooling apparatus comprises a mainboard, a cooling fan, and a heat sink, provided on the mainboard and affixed to one end of a vent of the cooling fan. The heat sink comprises a groove, used for accommodating a heat-generating component provided on the mainboard; cooling fins, distributed within the heat sink and arranged on two sides of the groove; wherein a venting and cooling channel is constituted between the interior of the heat sink and the vent of the cooling fan.

Preferably, the heat sink is mainly composed of cooling units which are symmetrical on the left and right.

Preferably, a pair of the cooling units is fixedly connected by a connecting part.

Preferably, a fixed position is arranged at the setting position of the heat sink corresponding to the cooling fan, the cooling fan is fixed to the fixed position by fastening structure.

Preferably, the top of the heat sink is provided with a sliding groove along the horizontal direction, the connecting part is equipped with a slider matching the sliding groove, a sliding fixation is formed between the slider and the sliding groove.

Preferably, the cooling unit is provided with recesses opposite to each other, and the recesses are provided with a hook-like structure inside the end of the recesses; a pair of recesses constitutes a structure of the sliding groove; a slider structure comprises a fixed bar disposed vertically and a fixed plate disposed horizontally, an end of the fixing plate is provided with a clamping structure reversely matched to the recesses.

Preferably, the cooling fins are arranged regularly from top to bottom.

Preferably, the four corners of the heat sink are respectively provided with a first fixing hole, the four corners of the cooling fan are provided with a second fixed hole corresponding to the first fixing hole one, the first fixing hole and the second fixing hole are fixed by a thread.

Preferably, the outer side wall of the heat sink is close to a row of heating devices disposed on the mainboard.

Preferably, a cross-sectional area of the inlet and outlet of the cooling fan is less than or equal to a cross-sectional area of one end of the heat sink.

The beneficial effect of the technical solution is such that, with other heat-generating components placed in the heat sink, the space in the heat sink is fully utilized, the fan is utilized to cool the heat sink and the heat-generating components therein, thus increasing the utilization rate of the fan, increasing the cooling efficiency, and effectively utilizing space.

BRIEF DESCRIPTION OF DRAWINGS

Refer to the accompanying drawings to describe embodiments of the present invention more fully. However, the attached drawings are for illustrative and elaboration only and do not constitute a limitation on the scope of the invention.

Figure 1:
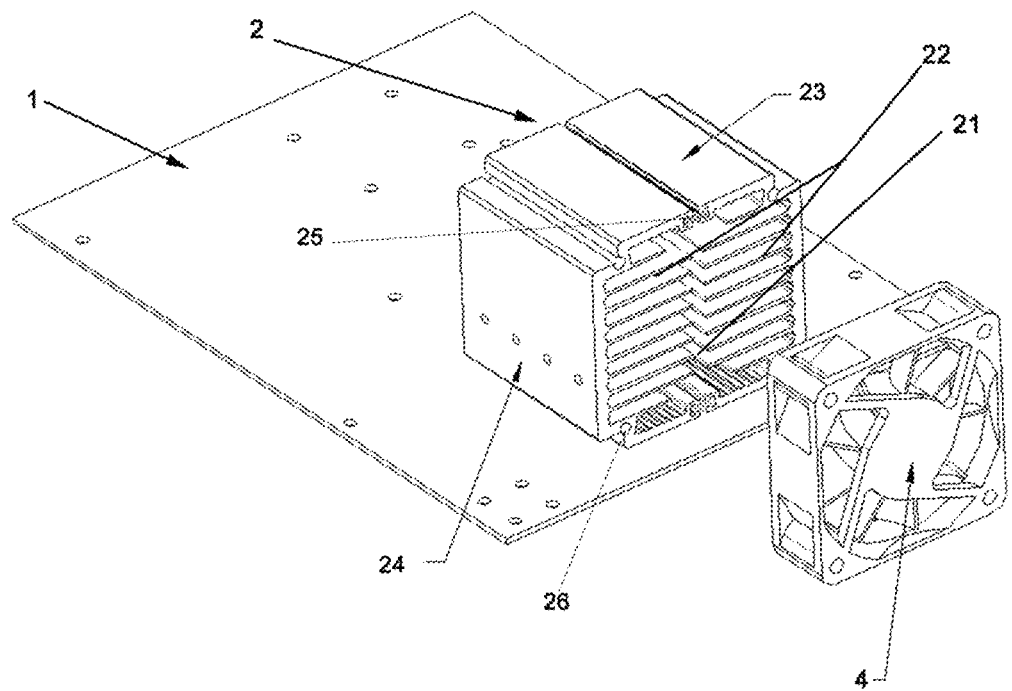
FIG. 1 is a schematic diagram of the explosion structure of an embodiment of the novel cooling apparatus of the present invention.

The above markings in the drawings indicate: 1. mainboard; 2. heat sink; 3. heat-generating component; 4. Cooling fan; 21. groove; 22. fin; 23. cooling unit; 24. cooling unit; 25. sliding groove; 26. fixed position; 27. connecting part.

DETAILED DESCRIPTION OF THE INVENTION

The technical scheme in the embodiment of the invention is described clearly and completely in combination with the drawings attached in the embodiment of the invention. Obviously, the embodiments described below are only partial of this invention, but not all embodiments. Based on the embodiments in the invention, any other embodiment acquired by those skilled in this field without creative labor will fall within the scope of the invention.

It should be noted that embodiments and features in embodiments of the invention may be combined with each other without conflict.

The invention is further explained in combination with the attached drawings and specific embodiments below, but it should not be regarded as the limitation of the invention.

The present invention comprises a novel cooling apparatus.

Figure 2:
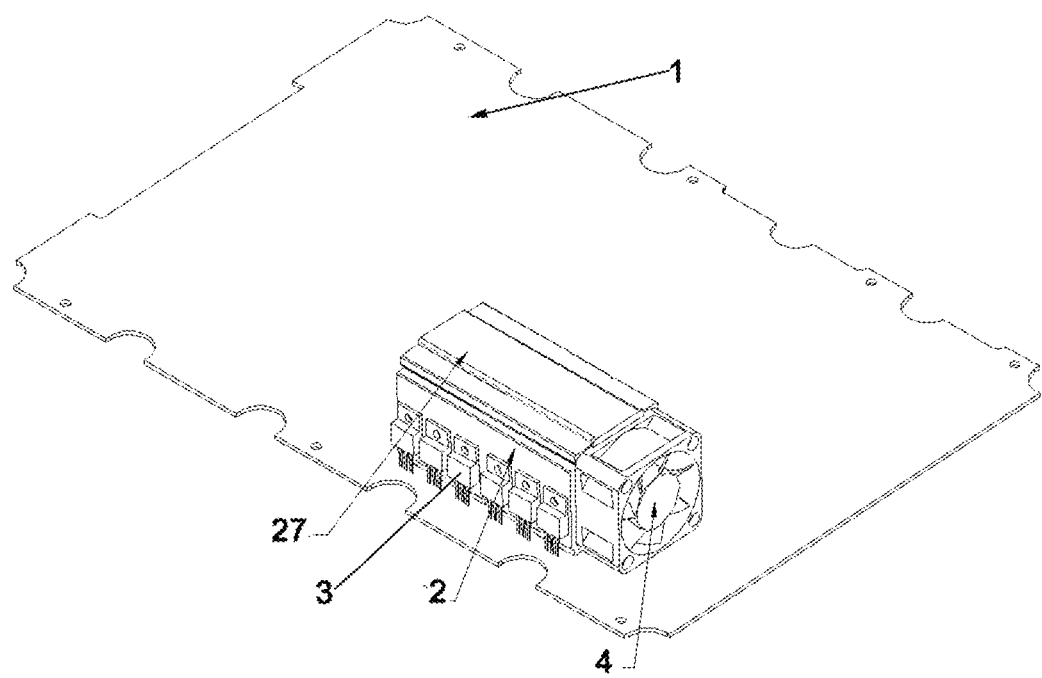
FIG. 2 is a schematic diagram of the explosion structure of an embodiment of the novel cooling apparatus of the present invention.
Figure 3:
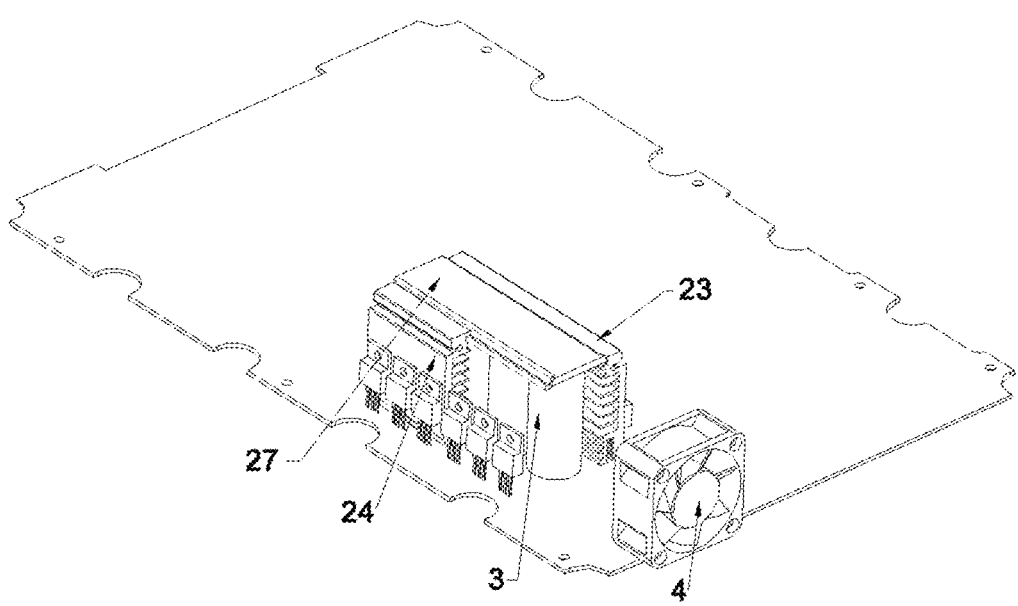
FIG. 3 is a schematic diagram of the explosion structure of an embodiment of the novel cooling apparatus of the present invention.

As shown in FIGS. 1 to 3, a novel cooling apparatus, including a mainboard 1, a cooling fan 4, a heat sink 2, provided on the mainboard 1 and affixed to one end of a vent of the cooling fan 4. The heat sink 2 comprises a groove 21, used for accommodating a heat-generating component 3 provided on the mainboard 1; cooling fins 22, distributed within the heat sink 2 and arranged on two sides of the groove 21; wherein a venting and cooling channel is constituted between the interior of the heat sink and the vent of the cooling fan 4.

In the above technical scheme, by placing other heat-generating component 3 in the heat sink 2 to make full use of the space between two heat sinks 2, the fan is used to cool the heat sink 2 and heat-generating component 3 in the middle at the same time. When operating, the fan rotates and the air on one side forms negative pressure. Because the one side of heat sink 2 is close to the end face of the fan, the cold air, forced by the fan, enters into the end face hole of the heat sink 2, passes through the heat-generating component 3 arranged in the middle of the heat sink 2, and discharges from the other side of the heat sink 2, taking away the heat from the heat sink 2 and also takes away the heat of heat-generating component 3 arranged in the middle of heat sink 2. The heat dissipation efficiency is increased and the space is effectively used.

In a preferred embodiment, the heat sink 2 is mainly composed of cooling units 23, 24 which are symmetrical on the left and right.

In a preferred embodiment, a pair of the cooling units 23, 24 is fixedly connected by a connecting part 27.

In a preferred embodiment, a fixed position 26 is arranged at the setting position of the heat sink 2 corresponding to the cooling fan 4, the cooling fan 4 is fixed to the fixed position 26 by fastening structure.

In a preferred embodiment, the top of the heat sink 2 is provided with a sliding groove 25 along the horizontal direction, the connecting part 27 is equipped with a slider matching the sliding groove 25, a sliding fixation is formed between the slider and the sliding groove 25.

In a preferred embodiment, the cooling units 23, 24 are provided with recesses opposite to each other, and the recesses are provided with a hook-like structure inside the end of the recesses; a pair of recesses constitute the structure of the sliding groove 25; the slider structure (not shown) comprises a fixed bar disposed vertically and a fixed plate disposed horizontally, an end of the fixing plate is provided with a clamping structure reversely matched to the recesses.

In the above technical scheme, the cooling unit 23, 24 can be made of metal material, such as aluminum, alloy material, etc. Between the bottom of the cooling unit 23, 24 and the mainboard 1 there is provided with a corresponding fixed fit, such as screw thread fixed fit, no specific restrictions are made here.

In a preferred embodiment, the cooling fins 22 are arranged regularly from top to bottom.

In a preferred embodiment, the four corners of the heat sink 2 are respectively provided with a first fixing hole, the four corners of the cooling fan 4 are provided with a second fixed hole corresponding to the first fixing hole, the first fixing hole and the second fixing hole are fixed by a thread.

In a preferred embodiment, the outer side wall of the heat sink 2 is close to a row of heating devices disposed on the mainboard 1.

In a preferred embodiment, a cross-sectional area of the inlet and outlet of the cooling fan 4 is less than or equal to a cross-sectional area of one end of the heat sink 2.

In the above technical scheme, placing other heat-generating component 3 between the two cooling units 23, 24 matching to each other, makes full use of the space between two cooling unit 23, 24, the fan is used to cool the heat sink 2 and heat-generating component 3 in the middle at the same time, thus increasing the utilization rate of the fan, increasing the cooling efficiency, and effectively utilizing space.

The above is only preferred embodiments of the invention and does not therefore limit the embodiment mode and scope of protection of the invention. Those skilled in the field should be aware that any scheme resulting from equivalent substitution and obvious changes made by the use of the specification and pictorial contents of the invention should be included in the scope of the invention.

What is claimed is:

1. A novel cooling apparatus, comprising: a mainboard, a cooling fan, a heat sink, provided on the mainboard and affixed to one end of a vent of the cooling fan; the heat sink comprises: a groove, used for accommodating a heat-generating component provided on the mainboard; cooling fins, distributed within the heat sink and arranged on two sides of the groove; wherein a venting and cooling channel is constituted between an interior of the heat sink and the vent of the cooling fan; a cooling unit; wherein a pair of the cooling units are fixedly connected by a connecting part, a top of the heat sink is provided with a sliding groove along a horizontal direction, the connecting part is equipped with a slider structure matching the sliding groove, and a sliding fixation is formed between the slider structure and the sliding groove; and wherein the cooling units are provided with recesses opposite to each other, the recesses are provided with a hook-like structure inside the end of the recesses, a pair of the recesses constitutes a structure of the sliding groove, the slider structure comprises a fixed bar disposed vertically and a fixed plate disposed horizontally, an end of the fixed plate is provided with a clamping structure reversely matched to the recesses.

2. The novel cooling apparatus of claim 1, wherein the heat sink is mainly composed of the cooling units which are symmetrical on the left and right.

3. The novel cooling apparatus of claim 1, wherein a fixed position is arranged at a setting position of the heat sink corresponding to the cooling fan, the cooling fan is fixed to the fixed position by fastening structure.

4. The novel cooling apparatus of claim 1, wherein the cooling fins are arranged regularly from top to bottom.

5. The novel cooling apparatus of claim 3, wherein four corners of the heat sink are respectively provided with a first fixing hole, the four corners of the cooling fan are provided with a second fixed hole corresponding to the first fixing hole, the first fixing hole and the second fixing hole are fixed by a thread.

6. The novel cooling apparatus of claim 1, wherein an outer side wall of the heat sink is close to a row of heating devices disposed on the mainboard.

7. The novel cooling apparatus of claim 1, wherein a cross-sectional area of the inlet and outlet of the cooling fan is less than or equal to a cross-sectional area of one end of the heat sink.

* * * * *